United States Patent
Lee et al.

(10) Patent No.: US 9,000,485 B2
(45) Date of Patent: Apr. 7, 2015

(54) ELECTRODE STRUCTURES, GALLIUM NITRIDE BASED SEMICONDUCTOR DEVICES INCLUDING THE SAME AND METHODS OF MANUFACTURING THE SAME

(75) Inventors: Jeong-yub Lee, Seoul (KR); Wenxu Xianyu, Gyeonggi-do (KR); Chang-youl Moon, Gyeonggi-do (KR); Yong-young Park, Daejeon (KR); Woo-young Yang, Gyeonggi-do (KR); In-jun Hwang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/489,733

(22) Filed: Jun. 6, 2012

(65) Prior Publication Data
US 2013/0105863 A1    May 2, 2013

(30) Foreign Application Priority Data
Oct. 27, 2011  (KR) .................. 10-2011-0110721

(51) Int. Cl.
*H01L 29/20*  (2006.01)
*H01L 21/28*  (2006.01)
*H01L 29/423*  (2006.01)
*H01L 29/66*  (2006.01)
*H01L 29/778*  (2006.01)
(Continued)

(52) U.S. Cl.
CPC .... *H01L 21/28264* (2013.01); *H01L 29/42364* (2013.01); *H01L 29/66462* (2013.01); *H01L 29/7787* (2013.01); *H01L 29/0843* (2013.01); *H01L 29/2003* (2013.01); *H01L 29/49* (2013.01)

(58) Field of Classification Search
USPC ............. 257/76, 194, 343, E29.242–E29.249
See application file for complete search history.

(56) References Cited

U.S. PATENT DOCUMENTS 6,762,083 B2   7/2004  Lee et al.
7,157,748 B2 *  1/2007  Saito et al. .................. 257/192
(Continued)

FOREIGN PATENT DOCUMENTS

JP      2009188215 A    8/2009

OTHER PUBLICATIONS

Y. A. Chen, D.a. Cohen and S.P. DenBaars, Low Resistance Ti/AL/Au Ohmic Backside Contacts to Nonpolar m-Plane n-GaN, Electronics Eletters, vol. 46, No. 2 Jan. 21, 2010.*
(Continued)

*Primary Examiner* — Matthew W Such
*Assistant Examiner* — Stephen C Smith
(74) *Attorney, Agent, or Firm* — Harness, Dickey & Pierce, P.L.C.

(57) ABSTRACT

An electrode structure, a GaN-based semiconductor device including the electrode structure, and methods of manufacturing the same, may include a GaN-based semiconductor layer and an electrode structure on the GaN-based semiconductor layer. The electrode structure may include an electrode element including a conductive material and a diffusion layer between the electrode element and the GaN-based semiconductor layer. The diffusion layer may include a material which is an n-type dopant with respect to the GaN-based semiconductor layer, and the diffusion layer may contact the GaN-based semiconductor layer. A region of the GaN-based semiconductor layer contacting the diffusion layer may be doped with the n-type dopant. The material of the diffusion layer may comprise a Group 4 element.

33 Claims, 13 Drawing Sheets

(51) Int. Cl.
*H01L 29/08* (2006.01)
*H01L 29/49* (2006.01)

(56) References Cited

U.S. PATENT DOCUMENTS

| | | | |
|---|---|---|---|
| 8,227,810 B2* | 7/2012 | Okada et al. | 257/76 |
| 2003/0157776 A1 | 8/2003 | Smith | |
| 2004/0084697 A1 | 5/2004 | Youn et al. | |
| 2007/0228416 A1 | 10/2007 | Chen et al. | |
| 2009/0078966 A1 | 3/2009 | Asai et al. | |
| 2010/0084687 A1* | 4/2010 | Chen et al. | 257/194 |
| 2011/0049526 A1* | 3/2011 | Chu et al. | 257/76 |
| 2012/0061727 A1* | 3/2012 | Lee et al. | 257/183 |
| 2013/0001657 A1* | 1/2013 | Cheng et al. | 257/288 |
| 2013/0228827 A1* | 9/2013 | Takemae et al. | 257/194 |

OTHER PUBLICATIONS

Q. Feng, et al., "The improvement of ohmic contact of Ti/Al/Ni/Au to AlGaN/GaN HEMT by multi-step annealing method," *Solid State Electronics*, vol. 53, pp. 955-958 (2009).

* cited by examiner

ANNEALING

ANNEALING (A)
○ : Ga (GROUP 3)
◎ : N (GROUP 5)

(B)
○ : Ga (GROUP 3)
◎ : N (GROUP 5)

(A)
○ : Ga (GROUP 3)
◎ : N (GROUP 5)
⊕ : Ge (GROUP 4)

(B)
○ : Ga (GROUP 3)
◎ : N (GROUP 5)
⊕ : Ge (GROUP 4)

< COMPARATIVE EXAMPLE >

ELECTRODE STRUCTURES, GALLIUM NITRIDE BASED SEMICONDUCTOR DEVICES INCLUDING THE SAME AND METHODS OF MANUFACTURING THE SAME

CROSS-REFERENCE TO RELATED APPLICATION

This application claims the benefit of priority under 35 U.S.C. §119(e) from Korean Patent Application No. 10-2011-0110721, filed on Oct. 27, 2011, in the Korean Intellectual Property Office, the contents of which are incorporated herein by reference in their entirety.

BACKGROUND

1. Field

Example embodiments relate to electrode structures, gallium nitride based semiconductor devices including the same, and methods of manufacturing the same.

2. Description of the Related Art

A gallium nitride (GaN) based semiconductor has excellent material properties (e.g., a large energy gap, high thermal and chemical stability, high electron saturation speed (~3× $10^7$ cm/sec), etc.). In particular, an electronic device employing a GaN-based semiconductor has various favorable characteristics (e.g., a high breakdown electric field (~3×$10^6$ V/cm), a high maximum current density, stable operation characteristics at high temperatures, high thermal conductivity, etc.). In the case of a heterostructure field effect transistor (HFET) using a GaN-based heterojunction structure, electrons may be densely concentrated at the junction interface because band-discontinuity at a junction interface is large. Thus, electron mobility may increase. Due to such a material property, a GaN-based semiconductor may be applied not only to an optical device but also to an electronic device configured for high frequency and/or high power, or to a power device.

However, when a GaN-based semiconductor is applied to various electronic devices (or, semiconductor devices), it may be important to develop an electrode having an excellent contact characteristic with respect to the GaN-based semiconductor. For example, development and/or improvement of an electrode capable of ohmically contacting the GaN-based semiconductor, and a method of manufacturing the electrode, may greatly enhance performance of an electronic device (or, a semiconductor device).

SUMMARY

Example embodiments relate to electrode structures, gallium nitride based semiconductor devices including the same, and methods of manufacturing the same.

Provided are electrode structures having excellent contact characteristics with respect to a GaN-based semiconductor, and GaN-based semiconductor devices including the electrode structures.

Also, provided are electrode structures capable of decreasing an annealing temperature for an ohmic contact, and GaN-based semiconductor devices including the electrode structures.

Also, provided are methods of manufacturing the electrode structures and the GaN-based semiconductor devices.

Additional aspects will be set forth in part in the description which follows and, in part, will be apparent from the description, or may be learned by practice of the presented example embodiments.

According to an example embodiments, a GaN-based semiconductor device includes a GaN-based semiconductor layer; and an electrode structure on the GaN-based semiconductor layer, wherein the electrode structure comprises an electrode element including a conductive material; and a diffusion layer between the electrode element and the GaN-based semiconductor layer, the diffusion layer including a material which is an n-type dopant with respect to the GaN-based semiconductor layer and the diffusion layer contacting the GaN-based semiconductor layer, wherein a region of the GaN-based semiconductor layer contacting the diffusion layer is doped with the n-type dopant.

The material of the diffusion layer may comprise a Group 4 element.

The material of diffusion layer may include at least one selected from the group consisting of Ge, Si, Sn, Pb, and GeSi, wherein Ge, Si, Sn, Pb, GeSi and a combination thereof.

The diffusion layer may have a thickness of about 2 nm to about 20 nm.

The electrode element may have a multi-layered structure.

The electrode element may have a Ti/Al-based multi-layered structure.

The electrode element may have a structure selected from a Ti/Al structure, a Ti/Al/Ni/Au structure, a Ti/Al/TiN structure, a Ti/Al/Mo structure, and a Ti/Al/W structure.

At least a portion of the electrode element may further include the n-type dopant.

The GaN-based semiconductor layer may have a multi-layered structure including a GaN layer and an AlGaN layer.

The electrode structure may contact one selected from the GaN layer and the AlGaN layer.

The region of the GaN-based semiconductor layer contacting the diffusion layer may comprise nitrogen (N) vacancies.

A contact resistance between the electrode structure and the GaN-based semiconductor layer may be equal to or less than about $1\times10^{-4}$ Ω·cm$^2$.

The GaN-based semiconductor device may be a high electron mobility transistor (HEMT).

The GaN-based semiconductor device may be a power device.

The GaN-based semiconductor device may further include a source electrode on a first region of the GaN-based semiconductor layer; a drain electrode on a second region of the GaN-based semiconductor layer; and a gate electrode on the GaN-based semiconductor layer between the source electrode and the drain electrode, wherein at least one of the source electrode and the drain electrode is the electrode structure.

The GaN-based semiconductor device may further include a gate insulation layer between the gate electrode and the GaN-based semiconductor layer.

The GaN-based semiconductor layer may have a recessed portion. A portion of the gate insulation layer may be conformal with the recessed portion of the GaN-based semiconductor layer. The recessed portion of the semiconductor layer corresponds to a channel region.

The GaN-based semiconductor device may further include an etching barrier layer on the gate insulation layer.

The etching barrier layer may include at least one selected from silicon nitride, silicon oxide, aluminum nitride, aluminum oxide and a combination thereof.

The first and second regions of the GaN-based semiconductor layer may have respective recesses to respective depths.

The GaN-based semiconductor layer may have a multi-layered structure including a GaN layer and an AlGaN layer, and upper surfaces of the first and second regions are etched surfaces of one selected from the GaN layer and the AlGaN layer.

According to another example embodiment, a method of manufacturing a GaN-based semiconductor device, the method includes preparing a GaN-based semiconductor layer; and forming an electrode structure on the GaN-based semiconductor layer, wherein the forming an electrode structure includes forming a diffusion layer on the GaN-based semiconductor layer, the diffusion layer including a material which is an n-type dopant with respect to the GaN-based semiconductor layer; forming an electrode element including a conductive material on the diffusion layer; and annealing the diffusion layer and the GaN-based semiconductor layer so as to diffuse the n-type dopant of the diffusion layer into the GaN-based semiconductor layer.

The material of the diffusion layer may comprise a Group 4 element.

The material of the diffusion layer may include at least one selected from the group consisting of Ge, Si, Sn, Pb, and GeSi, wherein Ge, Si, Sn, Pb, GeSi and a combination thereof.

The diffusion layer may have a thickness of about 2 nm to about 20 nm.

The electrode element may have a multi-layered structure.

The electrode element may be formed to have a Ti/Al-based multi-layered structure.

The electrode element may have one selected from a Ti/Al structure, a Ti/Al/Ni/Au structure, a Ti/Al/TiN structure, a Ti/Al/Mo structure, and a Ti/Al/W structure.

The annealing may be performed at a temperature of about 600° C. to about 800° C.

The GaN-based semiconductor layer may have a multi-layered structure including a GaN layer and an AlGaN layer.

The electrode structure may contact one selected from the GaN layer and the AlGaN layer.

The GaN-based semiconductor device may be an HEMT.

The GaN-based semiconductor device may be a power device.

The method may further include forming a gate electrode on the GaN-based semiconductor layer; and forming a source electrode on a first region of the GaN-based semiconductor layer at one side of the gate electrode, and forming a drain electrode on a second region of the GaN-based semiconductor layer at another side of the gate electrode, wherein at least one of the source electrode and the drain electrode is the electrode structure.

The method may further include forming a gate insulation layer between the GaN-based semiconductor layer and the gate electrode.

The semiconductor layer may have a recessed portion. A portion of the gate insulation layer may be formed conformal with the recessed portion of the GaN-based semiconductor layer. The recessed portion of the semiconductor layer may correspond to a channel region.

The method may further include forming an etching barrier layer on the gate insulation layer.

The etching barrier layer may include at least one selected from the group consisting of silicon nitride, silicon oxide, aluminum nitride, aluminum oxide, and a combination thereof.

The method may further include etching the first and second regions of the GaN-based semiconductor layer to a desired (or, alternatively, predetermined) depth prior to forming the source electrode and the drain electrode.

The GaN-based semiconductor layer may have a multi-layered structure including a GaN layer and an AlGaN layer, and upper surfaces of the first and second regions may be etched. Etching of the upper surfaces of the first and second regions may form recesses in one selected from the GaN layer and the AlGaN layer.

The etching the first and second regions to a desired (or, alternatively, predetermined) depth may be performed by reactive ion etching (RIE).

BRIEF DESCRIPTION OF THE DRAWINGS

These and/or other aspects will become apparent and more readily appreciated from the following description of the example embodiments, taken in conjunction with the accompanying drawings of which.

DETAILED DESCRIPTION

Figure 1:
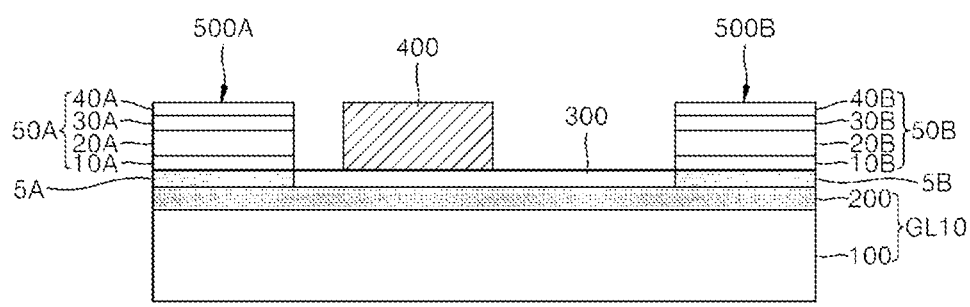
FIGS. 1 to 4 are cross-sectional views illustrating a GaN-based semiconductor device including an electrode structure, according to various embodiments.

Various example embodiments will now be described more fully with reference to the accompanying drawings in which the example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The example embodiments are described herein with reference to cross-sectional illustrations that are schematic illustrations of idealized embodiments (and intermediate structures) of the example embodiments. As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, an electrode structure, gallium nitride (GaN) based semiconductor devices and methods of manufacturing the same, according to example embodiments, will be described in detail. In the drawings, the thicknesses of layers and regions are exaggerated for clarity. Like reference numerals in the drawings denote like elements, and thus their description will not be repeated.

FIG. 1 is a cross-sectional view illustrating a GaN-based semiconductor device including an electrode structure, according to an example embodiment.

Referring to FIG. 1, a GaN-based semiconductor layer GL10 may be provided. The GaN-based semiconductor layer GL10 may have a multi-layered structure including a first semiconductor layer 100 and a second semiconductor layer 200. The first and second semiconductor layers 100 and 200 may be different GaN-based layers. Accordingly, the GaN-based semiconductor layer GL10 may refer to a layer including a heterojunction structure. The first semiconductor layer 100 may be, for example, a GaN layer, and the second semiconductor layer 200 may be, for example, an AlGaN layer. Polarizability of the second semiconductor layer 200 may be greater than that of the first semiconductor layer 100. A two-dimensional electron gas (2DEG) (not shown) may be formed in the first semiconductor layer 100 due to the second semiconductor layer 200. The 2DEG may be formed in the first semiconductor layer 100 below an interface between the first semiconductor layer 100 and the second semiconductor layer 200. The 2DEG may be used as an n-type channel. In this regard, the first semiconductor layer 100 may be a channel layer, and the second semiconductor layer 200 may be a channel supply layer. The second semiconductor layer 200 may have a thickness of equal to, or less than. about 50 nm, and the first semiconductor layer 100 may be thicker than the second semiconductor layer 200. The first and second semiconductor layers 100 and 200 may be disposed on a desired (or, alternatively, predetermined) substrate (not shown), and a desired (or, alternatively, predetermined) buffer layer (not shown) may further be provided between the substrate and the first semiconductor layer 100.

A gate insulation layer 300 may be disposed on (or, alternatively, over) the second semiconductor layer 200. The gate insulation layer 300 may include, for example, at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO and a combination thereof. Although not stated herein, the gate insulation layer 300 may be formed of any gate insulation layer materials used in general transistors. A gate electrode 400 may be disposed on (or, alternatively, over) the gate insulation layer 300. The gate electrode 400 may be formed of various conductive materials (e.g., a metal, a conductive oxide, or the like) used in general semiconductor devices.

A source electrode 500A and a drain electrode 500B may be disposed at both (or, respective) sides of the gate electrode 400 on the second semiconductor layer 200. The source electrode 500A may be formed closer to the gate electrode 400 than the drain electrode 500B. In other words, a distance between the source electrode 500A and the gate electrode 400 may be shorter than that between the drain electrode 500B and the gate electrode 400. However, this is just an example, and a relative distance between the source electrode 500A or the drain electrode 500B and the gate electrode 400 may vary. The gate insulation layer 300 may extend up to the source and drain electrodes 500A and 500B between the second semiconductor layer 200 and the gate electrode 400.

At least one of the source and drain electrodes 500A and 500B may have an electrode structure according to an example embodiment. Both the source and drain electrodes 500A and 500B may have a configuration of an electrode structure according to the current example embodiment. In the current example embodiment, the source and drain electrodes 500A and 500B may have the same configuration. Hereinafter, configurations of the source and drain electrodes 500A and 500B will be described in detail.

The source electrode 500A may include a diffusion layer 5A and an electrode element 50A that are disposed on a first region of the second semiconductor layer 200. The diffusion layer 5A may be disposed between the electrode element 50A and the second semiconductor layer 200. The electrode element 50A may have a multi-layered structure (e.g., a Ti/Al-based multi-layered structure). For example, the electrode element 50A may have a structure including a Ti layer 10A, an Al layer 20A, a Ni layer 30A, and an Au layer 40A that are sequentially stacked on the diffusion layer 5A. That is, the electrode element 50A may have a Ti/Al/Ni/Au structure. In this regard, the Ti layer 10A may be a layer contributing to an ohmic contact with respect to the second semiconductor layer 200, and the Al layer 20A may be a layer having a low resistance and excellent conductivity. The Ni layer 30A may be a diffusion barrier layer, and the Au layer 40A may be an oxidation barrier layer (a capping layer). The configuration of the electrode element 50A illustrated in FIG. 1 is just an example and may be changed in various ways. For example, the electrode element 50A may have any of Ti/Al, Ti/Al/TiN, Ti/Al/Mo, and Ti/Al/W structures, or may have different configurations.

The diffusion layer 5A may be a layer including a Group 4 element. For example, the diffusion layer 5A may include at least one of Ge, Si, Sn, Pb, GeSi and combinations thereof. For concrete example, the diffusion layer 5A may be a single element layer (e.g., a Ge layer, a Si layer, a Sn layer, or a Pb layer), or a compound layer (e.g., a GeSi layer). In this regard, Ge, Si, Sn, and Pb are Group 4 elements. The diffusion layer 5A may have a thickness of about 2 nm to about 20 nm, but may have a thickness of less than 2 nm if required. Due to such a diffusion layer 5A, ohmic contact characteristics of the source electrode 500A and the second semiconductor layer 200 may be improved. In detail, as the Group 4 element included in the diffusion layer 5A is diffused to a region of the second semiconductor layer 200 (i.e., the first region). The first region of the second semiconductor layer 200 may be doped with the Group 4 element. Because the doping of the Group 4 element may generate excess electrons in the first region of the second semiconductor layer 200, the first region of the second semiconductor layer 200 may easily become an n+ region. Accordingly, the ohmic contact characteristic between the source electrode 500A and the second semiconductor layer 200 may be improved. Also, a nitride (N) element in the first region of the second semiconductor layer 200 is diffused to the source electrode 500A, or a metal element (e.g., Ti) of the electrode element 50A is diffused to the second semiconductor layer 200 to be combined with the nitrogen (N) atoms of the second semiconductor layer 200, thereby generating N vacancies in the first region of the second semiconductor layer 200. The N vacancies have an n+ doping effect. Accordingly, according to the current example embodiment, the source electrode 500A and the second semiconductor layer 200 may easily form an ohmic contact, and a contact resistance therebetween may be extremely low. A contact resistance between the source electrode 500A and the second semiconductor layer 200 may be extremely low (e.g., equal to, or less than, about $1 \times 10^{-4}$ $\Omega \cdot cm^2$, or equal to, or less than, about $1 \times 10^{-5}$ $\Omega \cdot cm^2$).

The diffusion of the Group 4 element of the diffusion layer 5A to the second semiconductor layer 200 and the generation of the N vacancies in the second semiconductor layer 200 may be the result of annealing. That is, by performing a desired (or, alternatively, predetermined) annealing operation, the Group 4 element of the diffusion layer 5A may be diffused to the second semiconductor layer 200, and a metal element (e.g., Ti) of the electrode element 50A may be diffused to the second semiconductor layer 200 to be combined with the N atoms of the second semiconductor layer 200, thereby obtaining an ohmic contact characteristic between the source electrode 500A and the second semiconductor layer 200. In the current example embodiment, an excellent ohmic contact characteristic may be more easily obtained even at a low annealing temperature because the diffusion layer 5A is used. For example, at a temperature range of about 600° C. to about 800° C. may be used during annealing. Accordingly, deterioration of device characteristics due to a high temperature process may be prevented, and performance and/or efficiency of the GaN-based semiconductor device may be improved.

FIG. 7A is a view illustrating a three-dimensional (3D) crystal structure of a region of the second semiconductor layer (i.e. the first region) contacting the source electrode of FIG. 1, and FIG. 7B is a view illustrating a two-dimensional (2D) crystal structure of the region of the second semiconductor layer (i.e., the first region) contacting the source electrode of FIG. 1. FIGS. 7A and 7B illustrate a case where the second semiconductor layer is an AlGaN layer. Here, a Group 4 element doped (diffused) in the first region of the second semiconductor layer is Ge, wherein the Ge may be replaced with Si, Sn, Pb, or the like.

Referring to FIGS. 7A and 7B, the second semiconductor layer 200 is AlGaN having a wurzite crystal structure. When Ge (the Group 4 element) is doped in the second semiconductor layer 200, excess electrons e− may be generated. Also, N vacancies are formed in the AlGaN structure. The excess electrons e− and the N vacancies have an n+ doping effect. Accordingly, the region of the second semiconductor layer 200 (i.e., the first region) contacting the source electrode 500A of FIG. 1 may be an n+ region, and consequently, the source electrode 500A and the first region of the second semiconductor layer 200 may ohmically contact each other.

Referring back to FIG. 1, the drain electrode 500B may include a diffusion layer 5B and an electrode element 50B disposed on a second region of the second semiconductor layer 200. The diffusion layer 5B and the electrode element 50B of the drain electrode 500B may be the same as the diffusion layer 5A and the electrode element 50A of the source electrode 500A, respectively. The electrode element 50B of the drain electrode 500B may include a Ti layer 10B, an Al layer 20B, a Ni layer 30B, and an Au layer 40B, for example. A region of the second semiconductor layer 200 (i.e., the second region) contacting the drain electrode 500B may have the same crystal structure and characteristics as the region of the second semiconductor layer 200 (i.e., the first region) contacting the source electrode 500A. Thus, the drain electrode 500B and the second semiconductor layer 200 may have excellent ohmic contact characteristics.

Figure 2:
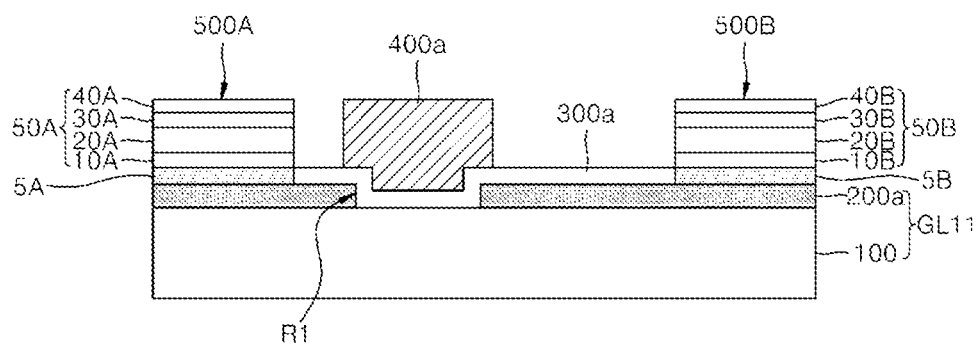

FIG. 2 is a cross-sectional view illustrating a GaN-based semiconductor device including an electrode structure, according to another example embodiment. A structure of the GaN-based semiconductor device of FIG. 2 is modified from that of FIG. 1.

Referring to FIG. 2, a GaN-based semiconductor layer GL11 having a recess region R1 may be provided. The GaN-based semiconductor layer GL11 may include a first semiconductor layer 100 and a second semiconductor layer 200a, and the recess region R1 may be formed in at least a desired (or, alternatively, predetermined) region of the second semiconductor layer 200a. The recess region R1 may be formed to have a depth at which an upper surface of the first semiconductor layer 100 is exposed, but the depth of the recess region R1 may vary. The depth of the recess region R1 may be larger, or smaller, than a thickness of the second semiconductor layer 200a. A gate electrode 400a may be disposed on (or, alternatively, over) the recess region R1. A gate electrode 400a may be disposed on sidewalls and on a bottom portion of the recess region R1. A gate insulation layer 300a may be disposed between the recess region R1 and the gate electrode 400a. A portion of channel region (i.e., a 2DEG) corresponding to the recess region R1 may be cut, or may have different characteristics (e.g., an electron concentration) than a remaining portion of the channel region. Accordingly, by forming the recess region R1, characteristics of the GaN-based semiconductor device may be controlled or improved. Meanwhile, configurations of the source electrode 500A and the drain electrode 500B may be the same as those described with reference to FIG. 1.

According to another example embodiment, after regions of the GaN-based semiconductor layers GL10 and GL11 at both sides of the gate insulation layers 300 and 300a of FIGS. 1 and 2 are etched, the source electrode 500A and the drain electrode 500B may be disposed on etched surfaces. A thickness (a depth) of the etching may be in the range of about 1 nm to about 120 nm. Accordingly, the etched surfaces may be etched surfaces of the second semiconductor layers 200 and 200a, or may be an etched surface of the first semiconductor layer 100. For example, after regions of the second semiconductor layer 200a at both sides of the gate insulation layer 300a of FIG. 2 are etched (recessed) to a desired (or, alternatively, predetermined) depth, the source electrode 500A and the drain electrode 500B may be disposed thereon as illustrated in FIG. 3.

Figure 3:
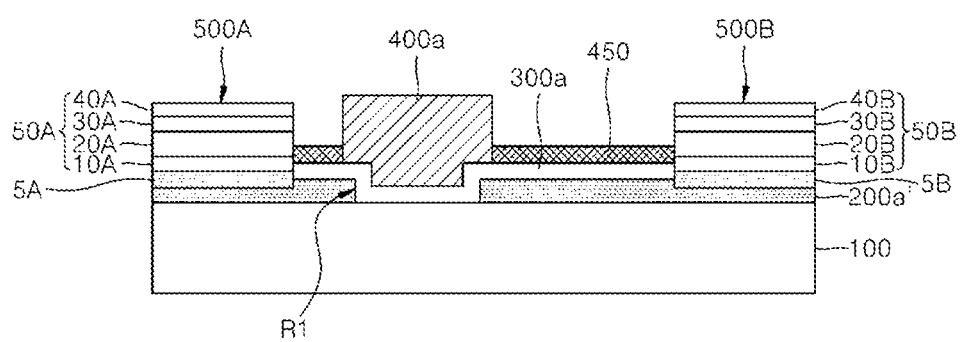

Referring to FIG. 3, a second semiconductor layer 200a' may have a structure in which regions at both sides of the gate insulation layer 300a (i.e., first and second regions) are partially etched (recessed) to a desired (or, alternatively, predetermined) thickness. The source electrode 500A and the drain electrode 500B may be disposed on etched surfaces of the second semiconductor layer 200a' (i.e., on surfaces of the first and second regions). As such, when the source electrode 500A and the drain electrode 500B are formed on the etched surfaces of the second semiconductor layer 200a', an atomic bond in the second semiconductor layer 200a' is broken due to the etching. Thus, there is a high possibility that N vacancies are formed in the first and second regions. Accordingly, it may decrease contact resistance between the second semiconductor layer 200a' and the source and drain electrodes 500A and 500B.

In FIG. 3, an etching barrier layer 450 may further be disposed on the gate insulation layer 300a. The etching barrier layer 450 may serve as a mask during an etching process for forming the etching regions of the second semiconductor layer 200a' (i.e., regions where the source and drain electrodes 500A and 500B are to be formed). In other words, the etching barrier layer 450 may protect the gate insulation layer 300a and a region of the second semiconductor layer 200a' disposed below the gate insulation layer 300a, during the etching process for forming the etching regions of the second semiconductor layer 200a'. The etching barrier layer 450 may include, for example, at least one of silicon nitride, silicon oxide, aluminum nitride, and aluminum oxide.

Figure 4:
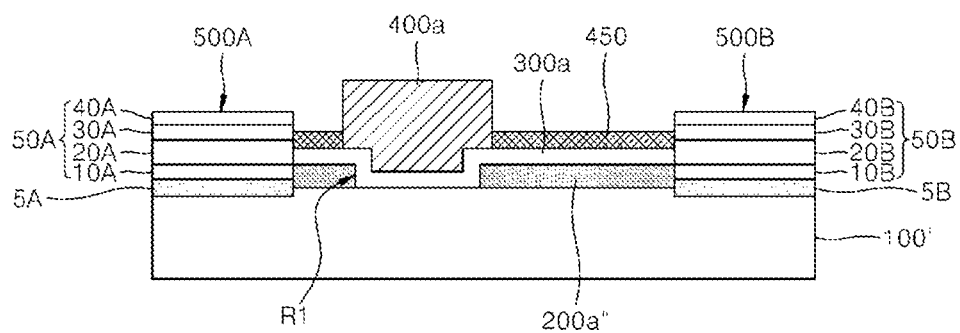

According to another example embodiment, regions of the second semiconductor layer 200a at both sides of the gate insulation layer 300a of FIG. 2 are etched (or, removed), and then the first semiconductor layer 100 under the second semiconductor layer 200a may be etched (or, recessed) to a desired (or, alternatively, predetermined) thickness as illustrated in FIG. 4.

Referring to FIG. 4, a second semiconductor layer 200a'' may have a structure in which regions at both sides of the gate insulation layer 300a are etched (or, removed), and a first semiconductor layer 100' may have a structure in which regions at both sides of the gate insulation layer 300a (i.e., first and second regions) are partially etched (recessed) to a desired (or, alternatively, predetermined) thickness. The source electrode 500A and the drain electrode 500B may be disposed on etched surfaces of the first semiconductor layer 100' (i.e., surfaces of the first and second regions). In this case, the etching barrier layer 450 described in FIG. 3 may be provided. As such, if the source electrode 500A and the drain electrode 500B are formed on the etched surfaces of the first semiconductor layer 100', an atomic bond in the first semiconductor layer 100' is broken due to the etching. Thus, there is a high possibility that N vacancies are formed in the first and second regions. Accordingly, it may decrease a contact resistance between the first semiconductor layer 100' and the source and drain electrodes 500A and 500B.

Figure 11:
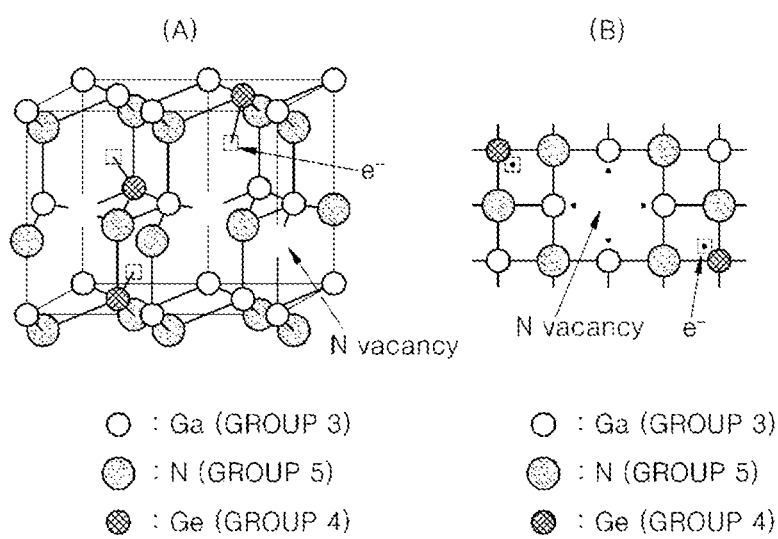
FIGS. 11A and 11B are views respectively illustrating 3D and 2D crystal structures of the region of the first semiconductor layer contacting the source electrode after performing the annealing of FIG. 9C, according to an example embodiment.

In FIG. 4, crystal structures of regions of the first semiconductor layer 100' contacting the source and drain electrodes 500A and 500B (i.e., the first and second regions) may be as illustrated in FIG. 11.

FIG. 11A is a view illustrating a 3D crystal structure of a region of the first semiconductor layer (i.e., the first region) contacting the source electrode of FIG. 4, and FIG. 11B is a view illustrating a 2D crystal structure of the region of the first semiconductor layer 100' (i.e., the first region) contacting the source electrode of FIG. 4. FIG. 11 illustrates a case where the first semiconductor layer is a GaN layer. Here, a Group 4 element doped (diffused) in the first region of the first semiconductor layer 100' is Ge, wherein the Ge may be replaced with Si, Sn, Pb, or the like.

Referring to FIGS. 11A and 11B, the first semiconductor layer 100' is GaN having a wurzite crystal structure, and when Ge (the Group 4 element) is doped in the first semiconductor layer 100', excess electrons e− may be generated. Also, N vacancies are formed in the GaN structure. The excess electrons e− and the N vacancies have an n+ doping effect. Accordingly, the first semiconductor layer 100' and the source electrode 500A may have excellent contact characteristics. In other words, the first semiconductor layer 100' and the source electrode 500A may ohmically contact each other, and a contact resistance therebetween may be extremely low.

In addition, in the current example embodiment, the Group 4 elements of the diffusion layers 5A and 5B may be diffused not only to the second semiconductor layers 200, 200a, and 200a' or the first semiconductor layer 100' but also to the electrode elements 50A and 50B. In other words, the electrode elements 50A and 50B may further include the Group 4 element. In particular, the Group 4 element may be contained in lower portions of the electrode elements 50A and 50B (e.g., the Ti layers 10A and 10B or the Al layers 20A and 20B). Also, as metals (e.g., Ti) of the electrode elements 50A and 50B are diffused to the second semiconductor layer 200, 200a, 200a' or the first semiconductor layer 100' to be combined with N atoms, a metal nitride may be formed. For example, Ti is diffused to the second semiconductor layers 200, 200a, and 200a' from the Ti layer 10A of the electrode element 50A, thereby forming TiN. Similarly, Al is diffused to the second semiconductor layers 200, 200a, and 200a' from the Al layer 20A, thereby forming AlN. Metals of the electrode elements 50A and 50B (e.g., Ti and Al, etc.) may remain in the diffusion layers 5A and 5B. Accordingly, the diffusion layers 5A and 5B may contain the metals of the electrode elements 50A and 50B (e.g., Ti and Al, etc.). Also, N atoms may be diffused to the electrode elements 50A and 50B from the second semiconductor layers 200, 200a, and 200a' or the first semiconductor layer 100'.

The above-described GaN-based semiconductor device according to the example embodiment may be a high electron mobility transistor (HEMT). Also, the GaN-based semiconductor device may be a heterostructure field effect transistor (HFET). Such a GaN-based semiconductor device may be used as, for example, a power device. However, the configuration and use of the above-described GaN-based semiconductor device are just examples and may be changed in various ways. Electrode structures of example embodiments may be applied not only to an HEMT or a power device, but also to various other GaN-based semiconductor devices.

FIGS. 5A to 5E are cross-sectional views illustrating a method of manufacturing a GaN-based semiconductor device including an electrode structure, according to an example embodiment.

Figure 5A:
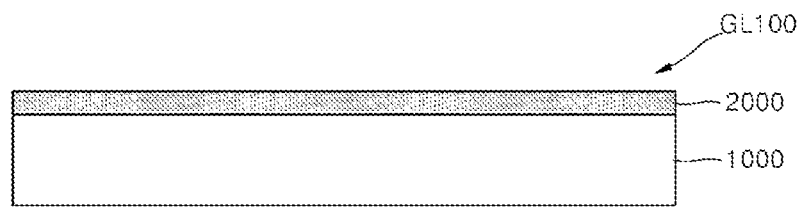
FIGS. 5A to 5E are cross-sectional views illustrating a method of manufacturing a GaN-based semiconductor device including an electrode structure, according to an example embodiment.

Referring to FIG. 5A, a GaN-based semiconductor layer GL100 may be prepared. The GaN-based semiconductor layer GL100 may have a multi-layer structure including a first semiconductor layer 1000 and a second semiconductor layer 2000. The first and second semiconductor layers 1000 and 2000 may be different GaN-based layers. For example, the first semiconductor layer 1000 may be a GaN layer, and the second semiconductor layer 2000 may be an AlGaN layer. Polarizability of the second semiconductor layer 2000 may be greater than that of the first semiconductor layer 1000. A 2DEG (not shown) may be formed in the first semiconductor layer 1000 due to the second semiconductor layer 2000. The 2DEG may be formed in the first semiconductor layer 1000 below an interface between the first semiconductor layer 1000 and the second semiconductor layer 2000.

Figure 5B:
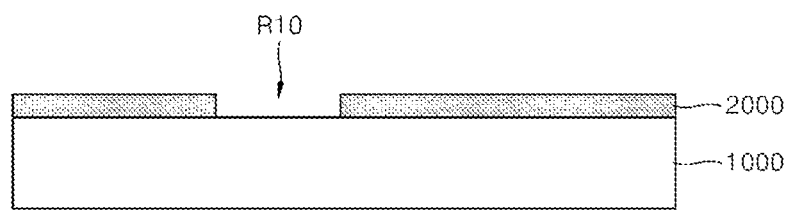

Referring to FIG. 5B, a recess region R10 may be formed by etching a desired (or, alternatively, predetermined) region of the second semiconductor layer 2000. A depth of the recess region R10 may be the same as, or similar to, a thickness of the second semiconductor layer 2000. The depth of the recess region R10 may vary. For example, the depth of the recess region R10 may be smaller, or larger, than the thickness of the second semiconductor layer 2000.

Figure 5C:
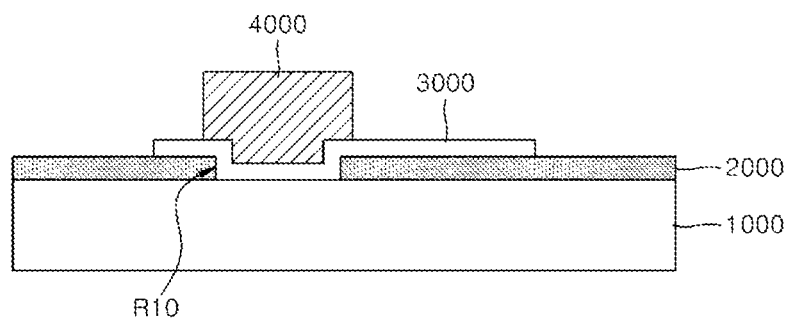
Figure 5D:
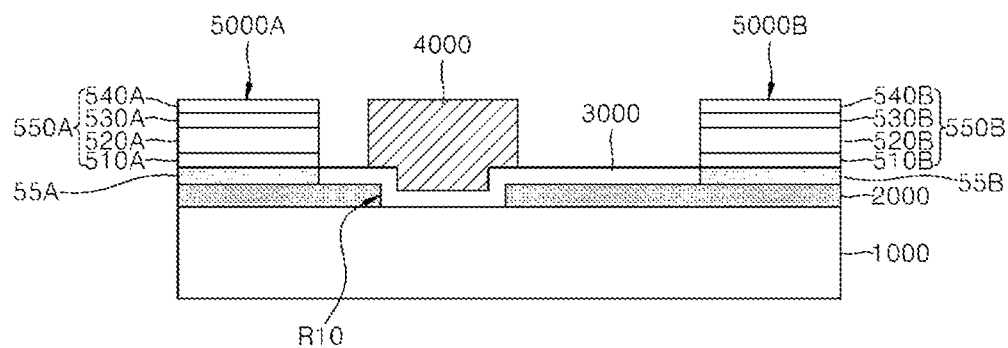

Referring to FIG. 5C, a gate insulation layer 3000 may be formed on the second semiconductor layer 2000 to cover the recess region R10. The gate insulation layer 3000 may include, for example, at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and a combination thereof. Although not stated herein, any gate insulation layer materials used in transistors may be applied to the gate insulation layer 3000. Because the gate insulation layer 3000 should be formed on clear (or, clean) surfaces of substrates (i.e., the first and second semiconductor layers 1000 and 2000), it may be desirable to form the gate insulation layer 3000 before forming source and drain electrodes (i.e., source and drain electrodes 5000A and 5000B of FIG. 5D). If the source and drain electrodes 5000A and 5000B of FIG. 5D are formed and then the gate insulation layer 3000 is formed, interfaces between the gate insulation layer 3000 and the first and second semiconductor layers 1000 and 2000 may be polluted due to materials of the source and drain electrodes 5000A and 5000B of FIG. 5D. In order to prevent the interfaces from being polluted, the gate insulation layer 3000 may be first formed. Then, a gate electrode 4000 may be formed on the gate insulation layer 3000 of the recess region R10. The gate electrode 4000 may be formed of any conductive materials (e.g., a metal, a conductive oxide, or the like) used in general semiconductor devices.

Referring to FIG. 5D, the source electrode 5000A and the drain electrode 5000B may be formed on the second semiconductor layer 2000 at both sides of the gate insulation layer 3000. The source electrode 5000A may include a diffusion layer 55A and an electrode element 550A, and the drain electrode 5000B may include a diffusion layer 55B and an electrode element 550B. The source electrode 5000A and the drain electrode 5000B may have the same configuration. The diffusion layers 55A and 55B may be formed of a material including a Group 4 element. For example, the diffusion layers 55A and 55B may be formed to include at least one of Ge, Si, Sn, Pb, GeSi and combinations thereof. In detail, the diffusion layers 55A and 55B may be formed as a single element layer (e.g., a Ge layer, a Si layer, a Sn layer, and a Pb layer), or a compound layer (e.g., a GeSi layer). The diffusion layers 55A and 55B may be formed to have a thickness of about 2 nm to about 20 nm, but may be formed to have a thickness less than 2 nm or more than 20 nm if required. The electrode elements 550A and 550B may be formed to have a multi-layered structure (e.g. a Ti/Al-based multi-layered structure). In detail, the electrode elements 550A and 550B may have a structure in which Ti layers 510A and 510B, Al layers 520A and 520B, Ni layers 530A and 530B, and Au layers 540A and 540B are sequentially stacked on the diffusion layers 55A and 55B, respectively (i.e., a Ti/Al/Ni/Au structure). In this regard, the Ti layers 510A and 510B may be layers contributing to an ohmic contact with respect to the second semiconductor layer 2000, and the Al layers 520A and 520B may be layers having a low resistance and providing excellent conductivity. The Ni layers 530A and 530B may be diffusion barrier layers, and Au layers 540A and 540B may be oxidation barrier layers (capping layers). Configurations of the electrode elements 550A and 550B are just examples and may be changed in various ways. For example, the electrode elements 550A and 550B may have any one of Ti/Al, Ti/Al/TiN, Ti/Al/Mo, and Ti/Al/W structures, or may have different configurations.

Figure 5E:
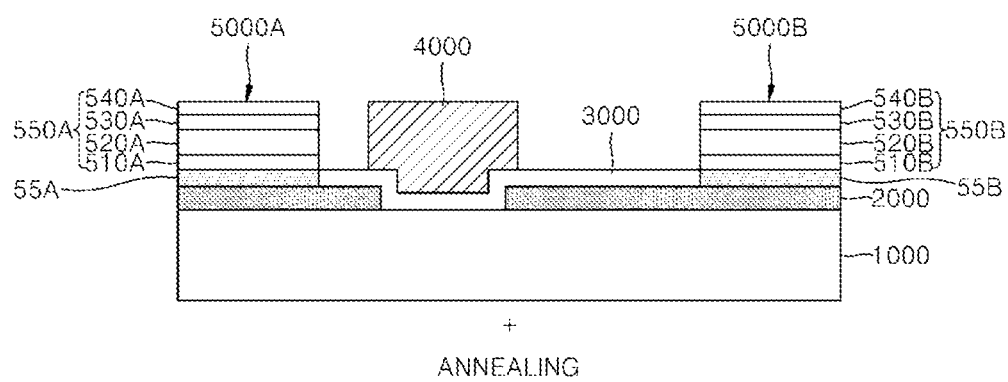

Referring to FIG. 5E, annealing may be performed on the first semiconductor layer 1000, the second semiconductor layer 2000, the source electrode 5000A, and the drain electrode 5000B. The annealing may be performed to obtain ohmic contact characteristics between the source electrode 5000A and the second semiconductor layer 2000 and between the drain electrode 5000B and the second semiconductor layer 2000. By performing the annealing, the Group 4 element may be diffused to regions of the second semiconductor layer 2000 (e.g., first and second regions) contacting the diffusion layers 55A and 55B from the diffusion layers 55A and 55B from the diffusion layers 55A and 55B. Thus, the Group 4 element is doped in the first and second regions of the second semiconductor layer 2000. As the first and second regions of the second semiconductor layer 2000 are doped with the Group 4 element, excess electrons (not shown) may be generated in the first and second regions. Also, N atoms may be diffused from the first and second regions of the second semiconductor layer 2000 to the source and drain electrodes 5000A and 5000B due to the annealing, or metals (e.g., Ti) are diffused from the electrode elements 550A and 550B to the first and second regions of the second semiconductor layer 2000 to be combined with the N atoms. Consequently, N vacancies may be generated in the first and second regions of the second semiconductor layer 2000. The excess electrons and the N vacancies may have an n+ doping effect. Accordingly, the first and second regions of the second semiconductor layer 2000 may be n+ doped, and may have an excellent contact characteristic with respect to the source and drain electrodes 5000A and 5000B.

In addition, during the annealing, the Group 4 elements of the diffusion layers 55A and 55B may be respectively diffused to the electrode elements 550A and 550B, and metal elements of the electrode elements 550A and 550B may be respectively diffused to the diffusion layers 55A and 55B. Accordingly, the electrode elements 550A and 550B may include the Group 4 element, and the diffusion layers 55A and 55B may include the metal element.

The annealing may be performed at a temperature of about 600° C. to about 800° C. by rapid thermal annealing (RTA), for example. The annealing may be performed under a nitrogen atmosphere or in a vacuum for 30 seconds to 2 minutes. The above-described conditions of annealing are just examples and may be changed in various ways as required.

The temperature of about 600° C. to about 800° C. at which the annealing is performed may have important significance. If the annealing is performed when the diffusion layers 55A and 55B are not formed and when only the electrode elements 550A and 550B are formed, a high temperature of about more than 850° C. may be necessary to obtain an ohmic contact formed without having a doping effect of the Group 4 element from the diffusion layers 55A and 55B. In other words, in order to achieve the ohmic contact by using only a doping effect due to N vacancies without using an n+ doping effect due to the excess electrons generated due to the Group 4 element, a high temperature process of more than 850° C. may be necessary. As such, when a high temperature process is performed, characteristics of the GaN-based semiconductor device may deteriorate. For example, characteristics of the gate insulation layer 3000 may deteriorate due to the high temperature process, so that a breakdown voltage of the gate insulation layer 3000 may be lowered, and a leakage current through the gate insulation layer 3000 may increase. Also, surface roughness of the electrode elements 550A and 550B may be degraded due to the high temperature process, or the electrode elements 550A and 550B or the gate electrode 4000 may be oxidized during the high temperature process. However, since the diffusion layers 55A and 55B are used in the current embodiment, an excellent ohmic characteristic may be obtained even through annealing at a relatively low temperature of, for example, about 600° C. to about 800° C., and thus the above-described problems of the high temperature process may be prevented, thereby obtaining a high performance/high efficiency semiconductor device.

Figure 6:
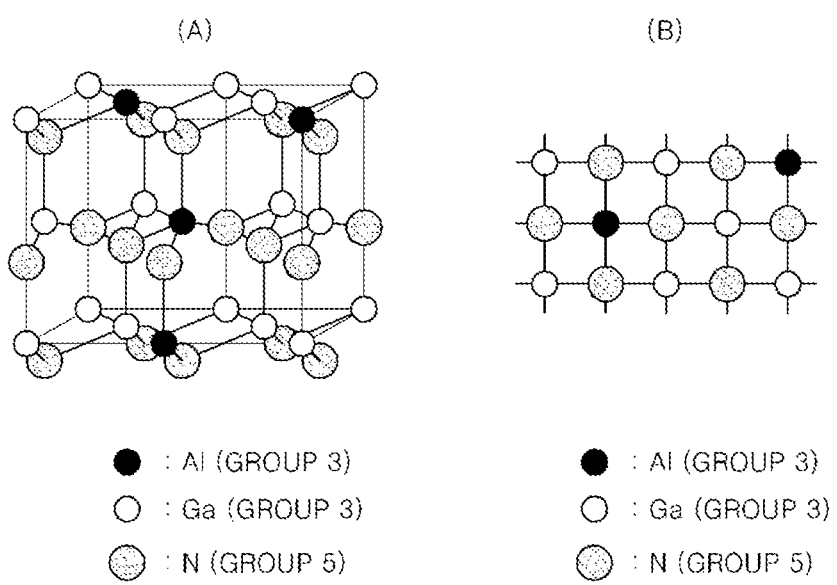
FIGS. 6A and 6B are views respectively illustrating three-dimensional (3D) and two-dimensional (2D) crystal structures of a region of a second semiconductor layer contacting a source electrode before performing annealing of FIG. 5E, according to an example embodiment.
Figure 7:
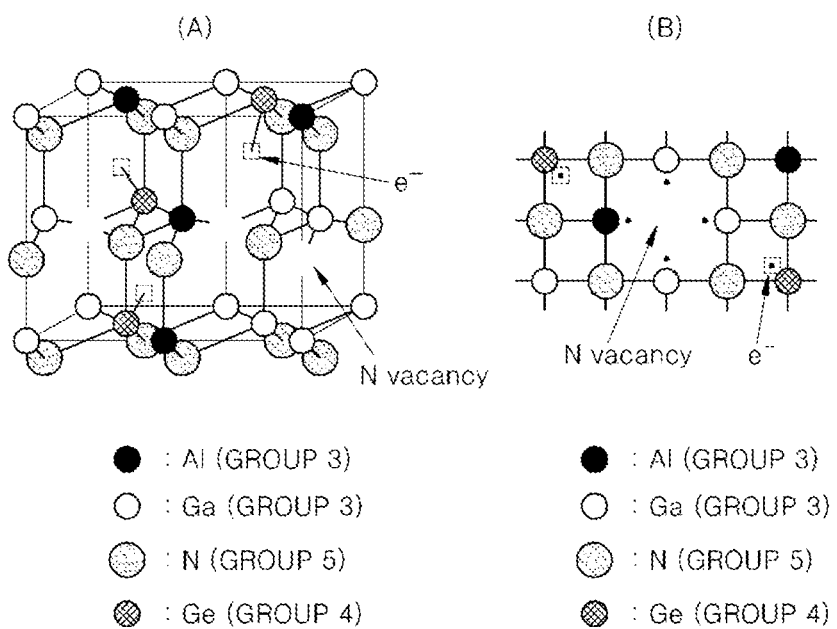
FIGS. 7A and 7B are views respectively illustrating 3D and 2D crystal structures of the region of the second semiconductor layer contacting the source electrode after performing the annealing of FIG. 5E, according to an example embodiment.

FIGS. 6A and 6B are views respectively illustrating 3D and 2D crystal structures a region of the second semiconductor layer 2000 contacting the source electrode 5000A before performing the annealing of FIG. 5E, according to an example embodiment, and FIGS. 7A and 7B are views respectively illustrating 3D and 2D crystal structures of the region of the second semiconductor layer 2000 contacting the source electrode 5000A after performing the annealing of FIG. 5E, according to an example embodiment. FIGS. 6 and 7 illustrate cases where the second semiconductor layer 2000 is an AlGaN layer. Also, in FIGS. 7A and 7B, a Group 4 element diffused to the second semiconductor layer 2000 is Ge, wherein the Ge may be replaced with Si, Sn, Pb, or the like.

Comparing FIGS. 6A and 6B to FIGS. 7A and 7B, excess electrons e− are generated due to the Ge element diffused to the second semiconductor layer 2000 (an AlGaN layer) through the annealing, and also N vacancies are generated. The second semiconductor layer 2000 (the AlGaN layer) may be easily n+ doped due to the excess electrons e− and the N vacancies. Consequently, the second semiconductor layer 2000 (the AlGaN layer) may have an excellent ohmic contact characteristic with respect to the source and drain electrodes 5000A and 5000B.

FIGS. 8A to 8D are cross-sectional views illustrating a method of manufacturing a GaN-based semiconductor device including an electrode structure, according to another example embodiment.

Figure 8A:
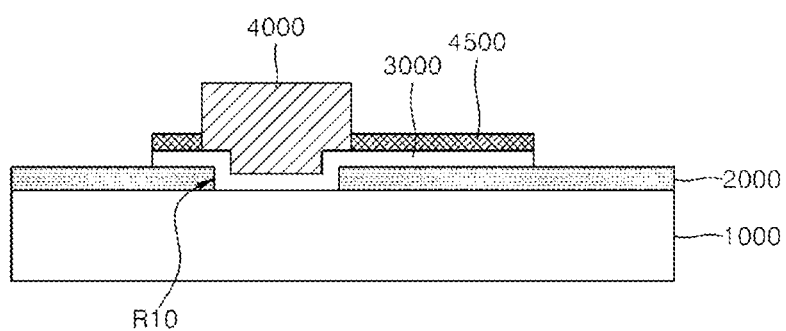
FIGS. 8A to 8D are cross-sectional views illustrating a method of manufacturing a GaN-based semiconductor device including an electrode structure, according to another example embodiment.

Referring to FIG. 8A, when the gate insulation layer 3000 is formed on the second semiconductor layer 2000 to cover the recess region R10, and the gate electrode 4000 is formed on the gate insulation layer 3000 (as illustrated in FIG. 5C), an etching barrier layer 4500 may be formed on (or, alternatively, over) the gate insulation layer 3000 around the gate electrode 4000. The etching barrier layer 4500 may include, for example, at least one of silicon nitride, silicon oxide, aluminum nitride, and aluminum oxide.

Figure 8B:
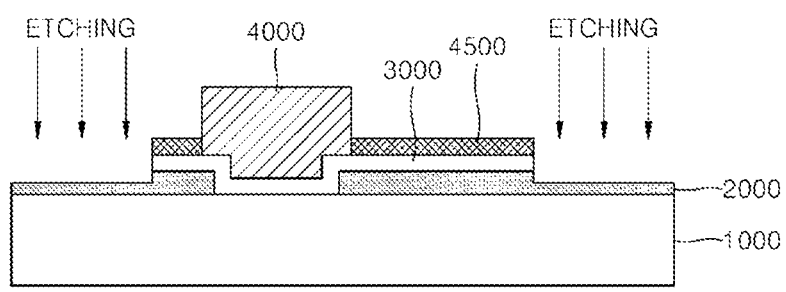

Referring to FIG. 8B, first and second regions of the second semiconductor layer 2000 at both sides of the etching barrier layer 4500 may be etched to a desired (or, alternatively, predetermined) depth by using the etching barrier layer 4500 and the gate electrode 4000 as etching masks. Here, the etching barrier layer 4500 may protect a region of the second semiconductor layer 2000 formed below the gate insulation layer 3000. The etching process may be performed, for example, by reactive ion etching (RIE). Thus, by etching the first and second regions of the second semiconductor layer 2000 to a desired (or, alternatively, predetermined) depth, an atomic bond in the first and second regions may be broken to a certain degree. In other words, when the second semiconductor layer 2000 is an AlGaN layer, a bond between Al and Ga and N may be broken. Accordingly, it may be easier to form N vacancies in the first and second regions of the second semiconductor layer 2000 in the subsequent process.

Figure 8C:
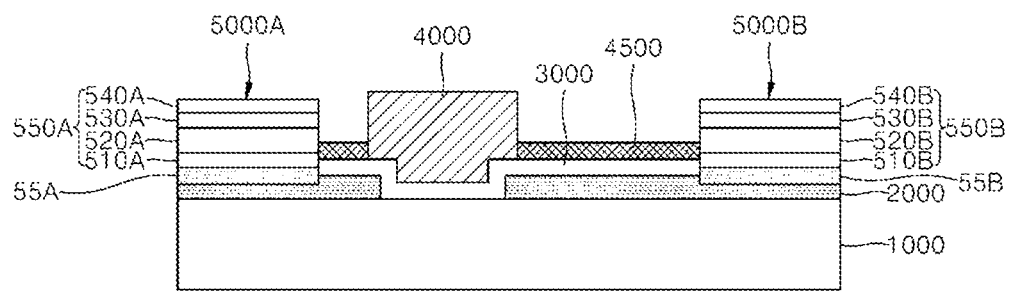

Referring to FIG. 8C, the source electrode 5000A and the drain electrode 5000B may be formed on the etched first and second regions of the second semiconductor layer 2000. The source electrode 5000A and the drain electrode 5000B may have configurations that are the same as those described with reference to FIG. 5D.

Figure 8D:
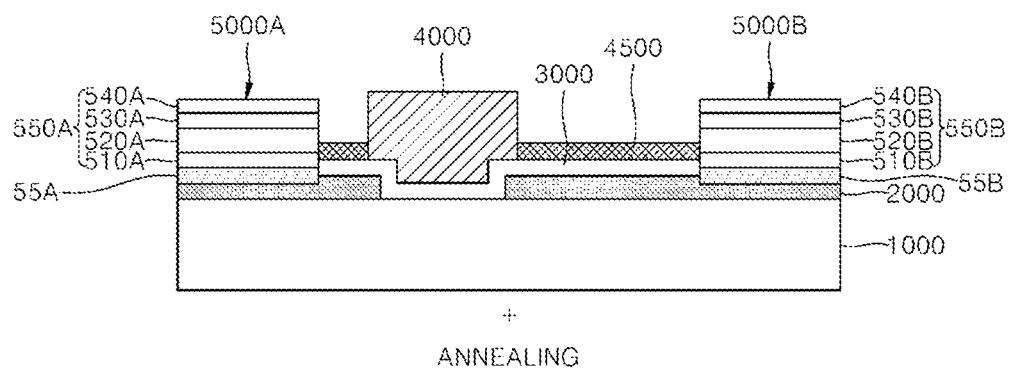

Referring to FIG. 8D, annealing may be performed on the first semiconductor layer 1000, the second semiconductor layer 2000, the source electrode 5000A, and the drain electrode 5000B. Conditions under which the annealing is performed may be the same as, or similar to, those described with reference to FIG. 5E. By performing the annealing, ohmic contact characteristics between the source electrode 5000A and the second semiconductor layer 2000, and between the drain electrode 5000B and the second semiconductor layer 2000, may be obtained.

Figure 9A:
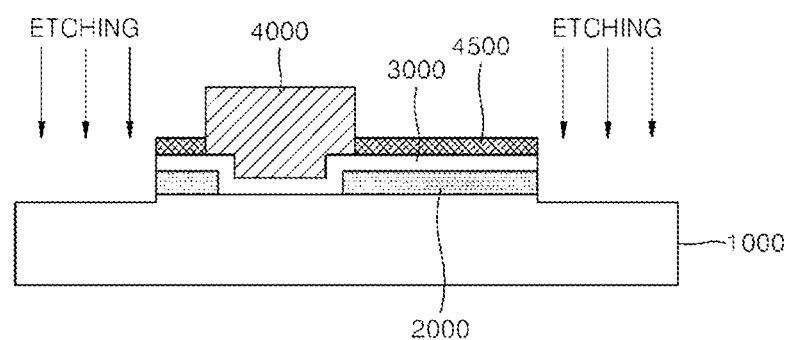
FIGS. 9A to 9C are cross-sectional views illustrating a method of manufacturing a GaN-based semiconductor device including an electrode structure, according to yet another example embodiment.
Figure 9B:
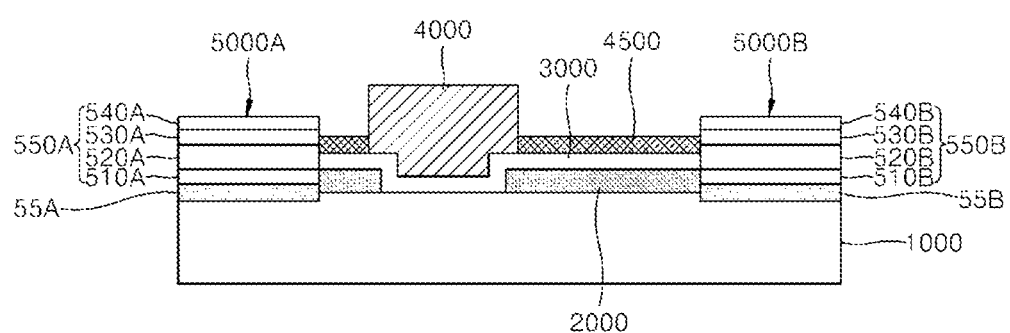
Figure 9C:
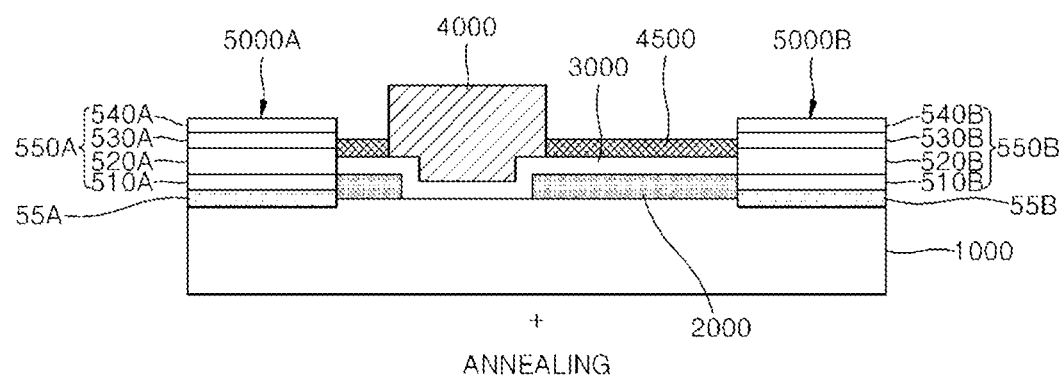

FIGS. 9A to 9C are cross-sectional views illustrating a method of manufacturing a GaN-based semiconductor device including an electrode structure, according to another example embodiment.

Referring to FIG. 9A, when the etching barrier layer 4500 is formed as illustrated in FIG. 8A, the second semiconductor layer 2000 may be etched by using the etching barrier layer 4500 and the gate electrode 4000 as etching masks, and regions of the first semiconductor layer 1000 under the second semiconductor layer 2000 (i.e., first and second regions) may be partially etched to a desired (or, alternatively, predetermined) thickness. The etching process may be performed, for example, by RIE. By etching the first and second regions of the first semiconductor layer 1000 to a desired (or, alternatively, predetermined) depth, an atomic bond in the first and second regions may be broken to a certain degree. Accordingly, it may be easier to form N vacancies in the first and second regions of the first semiconductor layer 1000 in the subsequent process.

Referring to FIG. 9B, the source electrode 5000A and the drain electrode 5000B may be formed on the etched first and second regions of the first semiconductor layer 1000. The source electrode 5000A and the drain electrode 5000B may have configurations that are the same as those described with reference to FIG. 5D.

Referring to FIG. 9C, annealing may be performed on the first semiconductor layer 1000, the second semiconductor layer 2000, the source electrode 5000A, and the drain electrode 5000B. Conditions under which the annealing is performed may be the same as, or similar to, those described with reference to FIG. 5E. By performing the annealing, ohmic contact characteristics between the source electrode 5000A and the first semiconductor layer 1000, and between the drain electrode 5000B and the first semiconductor layer 1000, may be obtained.

Figure 10:
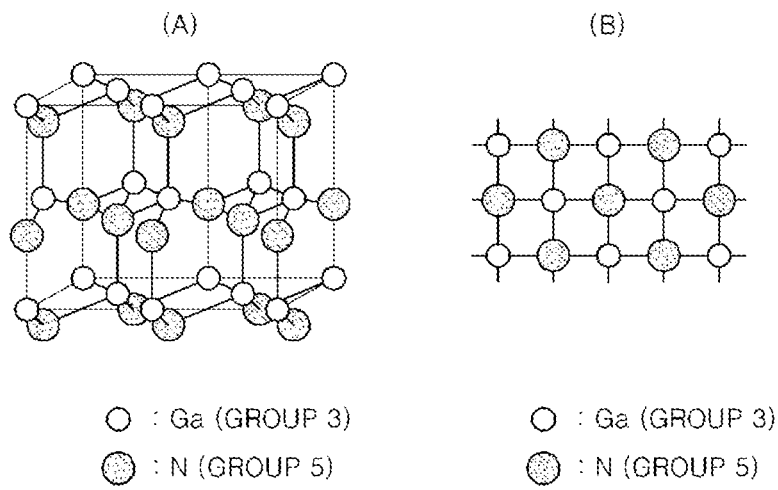
FIGS. 10A and 10B are views respectively illustrating 3D and 2D crystal structures of a region of a first semiconductor layer contacting a source electrode before performing annealing of FIG. 9C, according to an example embodiment.

FIGS. 10A and 10B are views respectively illustrating 3D and 2D crystal structures of a region of the first semiconductor layer contacting the source electrode before performing the annealing of FIG. 9C, according to an example embodiment, and FIGS. 11A and 11B are views respectively illustrating 3D and 2D crystal structures of the region of the first semiconductor layer contacting the source electrode 5000A after performing the annealing of FIG. 9C, according to an example embodiment. FIGS. 10A to 11B illustrate cases where the first semiconductor layer is a GaN layer. Also, in FIGS. 11A and 11B, a Group 4 element diffused to the first semiconductor layer is Ge, wherein the Ge may be replaced with Si, Sn, Pb, or the like. Meanwhile, the above-described atomic bond breaking effect is not reflected in FIGS. 10 and 11.

Comparing FIGS. 10A and 10B to FIGS. 11A and 11B, excess electrons e– are generated due to the Ge element diffused to the first semiconductor layer 1000 (a GaN layer) through the annealing, and also N vacancies are generated. The first semiconductor layer 1000 (the GaN layer) may be easily n+ doped due to the excess electrons e– and the N vacancies. Consequently, the first semiconductor layer 1000 (the GaN layer) may have an excellent ohmic contact characteristic with respect to the source and drain electrodes 5000A and 5000B.

Figure 12:
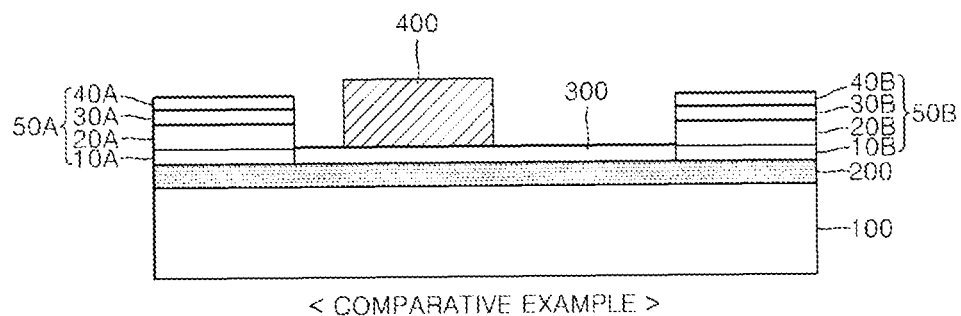
FIG. 12 is a cross-sectional view illustrating a GaN-based semiconductor device according to a comparative example.

FIG. 12 is a cross-sectional view illustrating a GaN-based semiconductor device according to a comparative example. The GaN-based semiconductor device illustrated in FIG. 12 has substantially the same structure as that illustrated in FIG. 1, except for the diffusion layers 5A and 5B of FIG. 1. In other words, in FIG. 12, electrode elements 50A and 50B are directly formed on a second semiconductor layer 200. The GaN-based semiconductor device of FIG. 12 may be formed by high temperature annealing performed at a temperature about 850° C.

Figure 13:
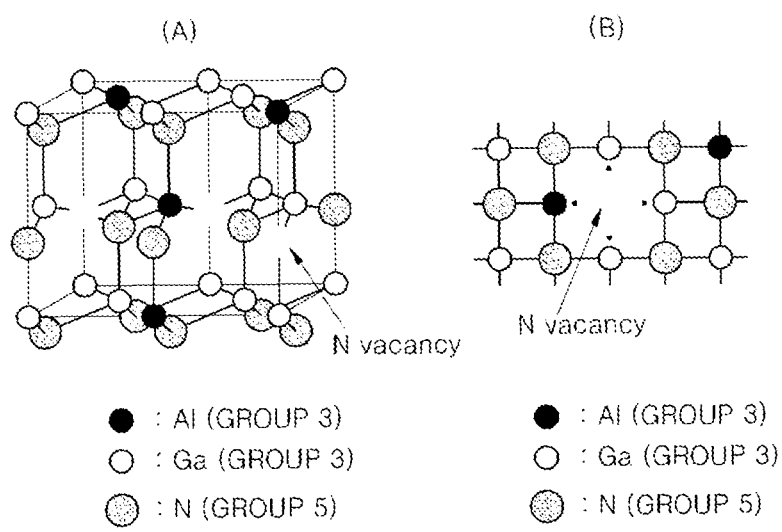
FIGS. 13A and 13B are views respectively illustrating 3D and 2D crystal structures of a region of a second semiconductor layer contacting an electrode element (source electrode) of FIG. 12.

FIGS. 13A and 13B are views respectively illustrating 3D and 2D crystal structures of a region of the second semiconductor layer (i.e., a first region) contacting the electrode element (i.e., a source electrode) of FIG. 12. FIGS. 13A and 13B illustrate a case where the second semiconductor layer is an AlGaN layer.

Referring to FIGS. 13A and 13B, the second semiconductor layer 200 is AlGaN having a wurzite crystal structure, and N vacancies are formed in the AlGaN structure. As such, in the comparative example, since an ohmic contact should be formed by using only a doping effect due to the N vacancies, a high temperature annealing process performed at a temperature equal to or above 850° C. is necessary to obtain a contact resistance of a desired degree. Such a high temperature annealing process may have an adverse affect on a semiconductor device and/or may increase a process burden and a manufacturing cost.

Table 1 below shows contact resistances of electrode structures according to a comparative example and the example embodiments. In Table 1, the electrode structure according to the comparative example has a Ti/Al/Ni/Au structure, and etching with respect to a lower layer (GaN/AlGaN) is not performed. An electrode structure of Sample 1 has a Ti/Al/Ni/Au structure, and a lower layer (GaN/AlGaN) is etched to about 3 nm. An electrode structure of Sample 2 has a Ge/Ti/Al/Ni/Au structure, and a lower layer (GaN/AlGaN) is etched to about 3 nm. In Sample 2, a Ge layer corresponds to the diffusion layers 5A and 5B of FIG. 1. Contact resistances of Table 1 are measured by using a transmission line measurement (TLM) method.

TABLE 1

|  | COMPARATIVE EXAMPLE | SAMPLE 1 | SAMPLE 2 |
| --- | --- | --- | --- |
| ELECTRODE STRUCTURE | Ti/Al/Ni/Au | Ti/Al/Ni/Au | Ge/Ti/Al/Ni/Au |
| LOWER LAYER | GaN/AlGaN | GaN/AlGaN | GaN/AlGaN |
| ETCHING OF LOWER LAYER | No | 3 nm Etching (RIE) | 3 nm Etching (RIE) |
| ANNEALING TEMPERATURE | 750° C. | 750° C. | 750° C. |
| CONTACT RESISTANCE | $9.57 \times 10^{-3}$ $\Omega \cdot cm^2$ | $6.43 \times 10^{-4}$ $\Omega \cdot cm^2$ | $6.14 \times 10^{-6}$ $\Omega \cdot cm^2$ |

Referring to Table 1, in the comparative example, the electrode structure does not include a diffusion layer, and the lower layer is not etched. In Sample 1, the electrode structure does not include a diffusion layer, and the lower layer is etched to about 3 nm. In Sample 2, the electrode structure includes a diffusion layer (Ge), and the lower layer is etched to about 3 nm. Annealing conditions (e.g., a temperature, etc.) with respect to the comparative example and Samples 1 and 2 are the same. The contact resistance between the electrode structure of the comparative example and the lower layer is about $9.57 \times 10^{-3}$ $\Omega \cdot cm^2$, which is highest. The contact resistance between the electrode structure of Sample 1 and the lower layer is about $6.43 \times 10^{-4}$ $\Omega \cdot cm^2$, which is lower than the contact resistance of the comparative example. The resistance between the electrode structure of Sample 2 and the lower layer is about $6.14 \times 10^{-6}$ $\Omega \cdot cm^2$, which is lowest. Accordingly, if a diffusion layer is applied as described in the example embodiments, a contact resistance between an electrode and a lower layer, i.e., a GaN-based semiconductor layer, may be significantly decreased. Also, according to the results of the comparative example and Sample 1, even if a diffusion layer is not used, a contact resistance may be decreased when a lower layer (i.e., a GaN-based semiconductor layer) is etched and then an electrode structure is formed thereon.

Figure 14:
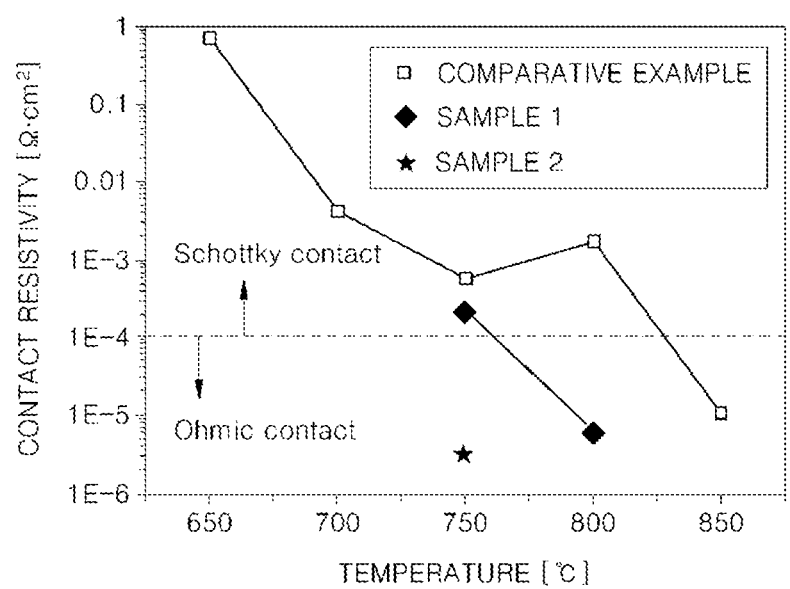
FIG. 14 is a graph showing changes in contact resistance according to annealing temperatures of electrode structures of a comparative example and Samples 1 and 2 of Table 1.

FIG. 14 is a graph showing changes in contact resistance according to annealing temperatures of electrode structures of the comparative example and Samples 1 and 2 of Table 1.

Referring to FIG. 14, when the annealing temperature is about 750° C., the electrode structure of Sample 2 shows an ohmic contact characteristic. Meanwhile, the electrode structures of the comparative example and Sample 1 show a Schottky contact characteristic. If the annealing temperature is increased to about 800° C., the electrode structure of Sample 1 shows an ohmic contact characteristic. Meanwhile, when the annealing temperature is increased to about 850° C., the electrode structure of the comparative example shows an ohmic contact characteristic. As such, according to the current example embodiment, because an annealing temperature for forming an ohmic contact may be remarkably decreased, deterioration of a semiconductor device due to a high temperature process may be prevented, thereby obtaining a high performance and/or high efficiency GaN-based semiconductor device.

While the present invention has been particularly shown and described with reference to example embodiments thereof by using specific terms, the embodiments and terms have been used for purpose of explanation and should not be construed as limiting in scope or as defined by the claims. For example, structures of the electrode structure and the GaN-based semiconductor device of FIGS. 1 to 4 may be modified in various ways. In detail, materials of the diffusion layers 5A and 5B, 55A, and 55B are not limited to a Group 4 element, and any material that may serve as an n-type dopant with respect to a GaN-based semiconductor may be applied to the materials of the diffusion layers 5A and 5B, 55A, and 55B. Also, the first semiconductor layers 100 and 100' or the second semiconductor layers 200, 200a, 200a', and 200a" may be formed of a different GaN-based material other than GaN or AlGaN, and another GaN-based semiconductor layer other than the first and second semiconductor layers 100, 100', 200, 200a, 200a', and 200a" may be further included. In addition, in the example embodiments, the gate insulation layers 300 and 300a may not be formed, and the gate electrodes 400 and 400a may be directly formed on the GaN-based semiconductor layer. Furthermore, the electrode structures according to the example embodiments may be applied to various semiconductor devices, which use a GaN-based semiconductor layer having a single-layered structure or a multi-layered structure, in various ways. Also, the manufacturing methods of FIGS. 5A to 5E, 8A to 8D, and 9A to 9C may be modified in various ways. In addition, one of ordinary skill in the art would understand that example embodiments may be applied to other GaN-based semiconductor devices other than an HEMT. Therefore, the scope is defined not by the detailed description but by the appended claims, and all differences within the scope will be construed as being included in the present invention.

It should be understood that the example embodiments described herein should be considered in a descriptive sense only and not for purposes of limitation. Descriptions of features or aspects within each example embodiment should typically be considered as available for other similar features or aspects in other example embodiments.

What is claimed is:

1. A GaN-based semiconductor device, comprising:
   a GaN-based semiconductor layer including a first region, a second region and a third region between the first region and the second region;
   an electrode structure on at least one of the first region and the second region of the GaN-based semiconductor layer, the electrode structure including,
      an electrode element including a conductive material, and
      a diffusion layer between the electrode element and the GaN-based semiconductor layer, the diffusion layer including a material which is an n-type dopant with respect to the GaN-based semiconductor layer, and the diffusion layer contacting at least one of the first region and the second region of the GaN-based semiconductor layer;
   a gate electrode over the GaN-based semiconductor layer;
   a gate insulation layer between the gate electrode and the GaN-based semiconductor layer; and
   an etching barrier layer on the gate insulation layer, the etching barrier layer over only the third region of the GaN-based semiconductor layer,
   wherein at least one of the first region and the second region of the GaN-based semiconductor layer has a first recess and is doped with the n-type dopant, and an upper surface of at least one of the first region and the second region of the GaN-based semiconductor layer is etched.

2. The GaN-based semiconductor device of claim 1, wherein the material of the diffusion layer comprises a Group 4 element.

3. The GaN-based semiconductor device of claim 1, wherein the material of the diffusion layer comprises at least one selected from Ge, Si, Sn, Pb, GeSi and a combination thereof.

4. The GaN-based semiconductor device of claim 1, wherein the diffusion layer has a thickness of about 2 nm to about 20 nm.

5. The GaN-based semiconductor device of claim 1, wherein the electrode element has a multi-layered structure.

6. The GaN-based semiconductor device of claim 5, wherein the electrode element has a Ti/Al-based multi-layered structure.

7. The GaN-based semiconductor device of claim 6, wherein the electrode element has a structure selected from a Ti/Al structure, a Ti/Al/Ni/Au structure, a Ti/Al/TiN structure, a Ti/Al/Mo structure, and a Ti/Al/W structure.

8. The GaN-based semiconductor device of claim 1, wherein at least a portion of the electrode element comprises the n-type dopant.

9. The GaN-based semiconductor device of claim 1, wherein
   the GaN-based semiconductor layer has a multi-layered structure comprising a GaN layer, and an AlGaN layer,
   the GaN layer contacts the diffusion layer, and
   the GaN layer is doped with the n-type dopant.

10. The GaN-based semiconductor device of claim 9, wherein the electrode structure contacts one selected from the GaN layer and the AlGaN layer.

11. The GaN-based semiconductor device of claim 1, wherein the at least one of the first region and the second region of the GaN-based semiconductor layer contacting the diffusion layer comprises nitrogen (N) vacancies.

12. The GaN-based semiconductor device of claim 1, wherein a contact resistance between the electrode structure and the GaN-based semiconductor layer is equal to or less than about $1 \times 10^{-4}$ $\Omega \cdot cm^2$.

13. The GaN-based semiconductor device of claim 1, wherein the GaN-based semiconductor device is a high electron mobility transistor (HEMT).

14. The GaN-based semiconductor device of claim 1, wherein the GaN-based semiconductor device is a power device.

15. The GaN-based semiconductor device of claim 1, wherein the GaN-based semiconductor device further comprises:
   a source electrode on one of the first region and the second region of the GaN-based semiconductor layer; and a drain electrode on one of the first region and the second region of the GaN-based semiconductor layer, at least one of the source electrode and the drain electrode being the electrode structure, wherein the gate electrode on the GaN-based semiconductor layer is between the source electrode and the drain electrode.

16. The GaN-based semiconductor device of claim 15, wherein,
the third region of the GaN-based semiconductor layer has a second recess, and
a portion of the gate insulation layer is conformal with the second recess of the GaN-based semiconductor layer.

17. The GaN-based semiconductor device of claim 16, wherein the second recess of the GaN-based semiconductor layer corresponds to a channel region.

18. The GaN-based semiconductor device of claim 1, wherein the etching barrier layer comprises at least one selected from silicon nitride, silicon oxide, aluminum nitride, aluminum oxide and a combination thereof.

19. The GaN-based semiconductor device of claim 15, wherein the first and second regions of the GaN-based semiconductor layer have respective recesses to respective depths.

20. The GaN-based semiconductor device of claim 18, wherein,
the GaN-based semiconductor layer has a multi-layered structure comprising a GaN layer and an AlGaN layer, and
the upper surface of the first region and an upper surface of the second region are etched surfaces of one selected from the GaN layer and the AlGaN layer.

21. A method of manufacturing a GaN-based semiconductor device, the method comprising:
preparing a GaN-based semiconductor layer including a first region, a second region and a third region between the first region and the second region;
forming an electrode structure on at least one of the first region and the second region of the GaN-based semiconductor layer,
the forming an electrode structure comprising,
forming a diffusion layer on the GaN-based semiconductor layer, the diffusion layer including a material which is an n-type dopant with respect to the GaN-based semiconductor layer, and the diffusion layer contacting at least one of the first region and the second region of the GaN-based semiconductor layer,
forming an electrode element including a conductive material on the diffusion layer, and
etching an upper surface of the at least one of the first region and the second region of the GaN-based semiconductor layer to form a first recess;
forming a gate electrode on the GaN-based semiconductor layer;
forming a gate insulation layer between the GaN-based semiconductor layer and the gate electrode;
forming an etching barrier layer on the gate insulation layer, the etching barrier layer over only the third region of the GaN-based semiconductor layer; and
annealing the diffusion layer and the GaN-based semiconductor layer so as to diffuse the n-type dopant of the diffusion layer into at least one of the first region and the second region of the GaN-based semiconductor layer.

22. The method of claim 21, wherein the material of the diffusion layer comprises a Group 4 element.

23. The method of claim 21, wherein the material of the diffusion layer comprises at least one selected from Ge, Si, Sn, Pb, GeSi and a combination thereof.

24. The method of claim 21, wherein the electrode element is formed to have a Ti/Al-based multi-layered structure.

25. The method of claim 21, wherein the annealing is performed at a temperature of about 600° C. to about 800° C.

26. The method of claim 21, wherein the GaN-based semiconductor layer has a multi-layered structure comprising a GaN layer and an AlGaN layer.

27. The method of claim 21, wherein the GaN-based semiconductor device is an HEMT.

28. The method of claim 21, further comprising:
forming a source electrode on one of the first region and the second region of the GaN-based semiconductor layer at one side of the gate electrode; and
forming a drain electrode on one of the first region and the second region of the GaN-based semiconductor layer at another side of the gate electrode, at least one of the source electrode and the drain electrode being the electrode structure.

29. The method of claim 21, wherein,
the third region of the semiconductor layer has a second recess, and
a portion of the gate insulation layer is formed conformal with the second recess of the GaN-based semiconductor layer.

30. The method of claim 29, wherein the second recess of the GaN-based semiconductor layer corresponds to a channel region.

31. The method of claim 28, further comprising:
etching the first and second regions of the GaN-based semiconductor layer to a desired depth prior to forming the source electrode and the drain electrode.

32. The method of claim 21, wherein,
the GaN-based semiconductor layer has a multi-layered structure comprising a GaN layer and an AlGaN layer, and
the etching an upper surface of at least one of the first region and the second region to forms the first in one selected from the GaN layer and the AlGaN layer.

33. The method of claim 31, wherein the etching the first and second regions to a desired depth is performed by reactive ion etching (RIE).

* * * * *